United States Patent
Qu et al.

(10) Patent No.: US 7,257,502 B1
(45) Date of Patent: Aug. 14, 2007

(54) DETERMINING METROLOGY SAMPLING DECISIONS BASED ON FABRICATION SIMULATION

(75) Inventors: Peng Qu, Austin, TX (US); Chandrashekar Krishnaswamy, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/363,748

(22) Filed: Feb. 28, 2006

(51) Int. Cl.
*H01L 21/00* (2006.01)
(52) U.S. Cl. ............... 702/83; 702/82; 702/84; 438/7; 438/8
(58) Field of Classification Search ............ 702/83–84, 702/105, 127; 700/121, 109, 74, 214, 182; 438/5–14
See application file for complete search history.

(56) References Cited

U.S. PATENT DOCUMENTS

| | | | |
|---|---|---|---|
| 6,766,214 B1* | 7/2004 | Wang et al. | 700/121 |
| 6,957,120 B1* | 10/2005 | Bode et al. | 700/121 |
| 7,076,321 B2* | 7/2006 | Purdy | 700/121 |
| 2005/0021272 A1* | 1/2005 | Jenkins et al. | 702/105 |

* cited by examiner

*Primary Examiner*—Michael P. Nghiem
*Assistant Examiner*—Hien Vo
(74) *Attorney, Agent, or Firm*—Williams, Morgan & Amerson, P.C.

(57) ABSTRACT

A method for determining metrology sampling rates for workpieces in a process flow includes determining a current status of the process flow. Future processing of the workpieces in the process flow is simulated based on the current status of the process flow over a predetermined time horizon to predict sampling rates for the workpieces. During the simulating, sampling rules are implemented that consider capacity constraints of a metrology resource in the process flow. Actual workpieces in the process flow are sampled based on the predicted metrology sampling rates.

21 Claims, 7 Drawing Sheets

DETERMINING METROLOGY SAMPLING DECISIONS BASED ON FABRICATION SIMULATION

CROSS-REFERENCE TO RELATED APPLICATIONS

Not applicable.

STATEMENT REGARDING FEDERALLY SPONSORED RESEARCH OR DEVELOPMENT

Not Applicable

BACKGROUND OF THE INVENTION

This invention pertains to automated manufacturing environments, such as semiconductor manufacturing, and, more particularly, to a method and apparatus for determining metrology sampling decisions based on fabrication simulation.

A semiconductor fabrication facility typically includes numerous processing tools used to fabricate semiconductor devices. The processing tools may include photolithography steppers, etch tools, deposition tools, polishing tools, rapid thermal processing tools, ion implantation tools, and the like. Wafers (or wafer lots) are processed in the tools in a predetermined order and each processing tool modifies the wafers according to a particular operating recipe so that a desired product is formed in or on the wafer. For example, a photolithography stepper may be used to form a patterned layer of photoresist above the wafer. Features in the patterned layer of photoresist correspond to a plurality of features, e.g. gate electrode structures, which will ultimately be formed above the surface of the wafer. When processing of the wafer is complete, the various features formed in or on the wafer, as well as features formed in or on layers that are deposited above the wafer, combined to form the desired product. Exemplary products include processors, memory elements, and the like.

The semiconductor fabrication facility typically also includes metrology tools for collecting data indicative of the physical state of one or more wafers before, during, and/or after processing by the processing tools. Data collected by the metrology tools may be used to characterize the wafer, to detect faults associated with the processing, or to determine the quality of the finished product. For example, a mean critical dimension associated with the various features may be indicative of a performance level of products formed on the wafer and/or the wafer lot. If the wafer state data indicates that the mean critical dimension associated with the feature, e.g., a gate electrode, is on the lower end of an allowable range for such feature sizes, then this may indicate that the product formed on the wafer may exhibit relatively high performance levels. For example, smaller feature sizes in a processor formed on the wafer may be associated with faster processing speeds. Higher performance products may be sold at a higher price, thereby increasing the profitability of the manufacturing operation.

High-volume manufacturing environments may be used to form the different products concurrently. For example, a single semiconductor fabrication facility may be used to form hundreds of different products including processors of varying processing speeds and/or architectures, memory elements of different types (e.g., EEPROM, flash memory, etc.) and/or sizes (e.g., 64 MB, 128 MB, etc), and the like. Wafers associated with each product are typically provided to at least one metrology tool to assess the performance of the products and/or to detect faults associated with processing. Because metrology tools are typically not provided in numbers sufficient to measure all wafers produced, a sampling approach is used.

Conventional metrology sampling plans are predetermined based on the process control information contained in each lot. In other words, lots including the same process control information are considered as a group. Sampling rates are based upon the groups. Product type is one component in the grouping. For example, if grouping A is expected to run 6 wafer lots per week, the metrology sampling plan associated with grouping A may be set to 100% so that all of the wafer lots associated with grouping A are sampled in the appropriate metrology tool. If grouping B is expected to run approximately 200 wafer lots a week, the metrology sampling plan may be set to a much lower value (e.g., 10-20%), so that fewer wafer lots associated with grouping B are provided to the metrology tools and the potential for bottlenecks at the metrology tools is reduced. The metrology tools may also be preconfigured to apply different business rules, filters, and/or weighting factors when performing metrology on grouping A or grouping B.

Changes in the anticipated processing volume associated with different products can cause serious problems for a semiconductor fabrication facility. For example, if demand for grouping A suddenly and/or unexpectedly increases and the semiconductor fabrication facility begins to run approximately 200 wafer lots per week to produce grouping A, the predetermined sampling plan will continue to indicate that 100% of the wafer lots associated with grouping A are to be sampled by the metrology tools. Consequently, a severe bottleneck may form at the metrology tools, which may reduce the production efficiency for grouping A, potentially resulting in lost profits for a product that is in high demand. Conversely, if the volume of wafer lots associated with grouping B drops, the lower sampling rate may not be sufficient to maintain the quality of grouping B and/or to detect faults that may occur during processing of grouping B.

In a conventional semiconductor fabrication facility, engineers typically change the predetermined sampling plans manually when the production volume associated with a product is expected to change. However, changing the sampling plans manually is typically time-consuming, labor-intensive, and may even require that production be halted while the new sampling plans are determined and implemented in the semiconductor fabrication facility. Moreover, engineers may not be able to anticipate all changes in the production volumes associated with different products and therefore may not be able to change the predetermined sampling plans to account for these unanticipated changes.

This section of this document is intended to introduce various aspects of art that may be related to various aspects of the present invention described and/or claimed below. This section provides background information to facilitate a better understanding of the various aspects of the present invention. It should be understood that the statements in this section of this document are to be read in this light, and not as admissions of prior art. The present invention is directed to overcoming, or at least reducing the effects of, one or more of the problems set forth above.

BRIEF SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One aspect of the present invention is seen in a method for determining metrology sampling rates for workpieces in a process flow. The method includes determining a current status of the process flow. Future processing of the workpieces in the process flow is simulated based on the current status of the process flow over a predetermined time horizon to predict sampling rates for the workpieces. During the simulation, sampling rules are implemented that consider capacity constraints of a metrology resource in the process flow. Actual workpieces in the process flow are sampled based on the predicted metrology sampling rates.

Another aspect of the present invention is seen in a system including a plurality of tools for processing workpieces in a process flow, a sampling unit, and a workflow controller. The sampling unit is operable to determine a current status of the process flow. The sampling unit is further operable to employ a fabrication simulation model to simulate future processing of the workpieces in the process flow based on the current status of the process flow over a predetermined time horizon to predict metrology sampling rates for the workpieces. The fabrication simulation model is operable to implement sampling rules during the simulating that consider capacity constraints of a metrology resource in the process flow. The workflow server is operable to sample actual workpieces in the process flow based on the predicted metrology sampling rates.

Yet another aspect of the present invention is seen in a sampling controller including a processing device operable to execute instructions that when implemented perform a method. The method includes determining a current status of a process flow. Future processing of workpieces in the process flow is simulated based on the current status of the process flow over a predetermined time horizon to predict metrology sampling rates for the workpieces. Sampling rules are implemented during the simulating that consider capacity constraints of a metrology resource in the process flow. The predicted metrology sampling rates are communicated to an entity operable to control the process flow.

BRIEF DESCRIPTION OF THE SEVERAL VIEWS OF THE DRAWINGS

The invention will hereafter be described with reference to the accompanying drawings, wherein like reference numerals denote like elements, and.

Figure 1:
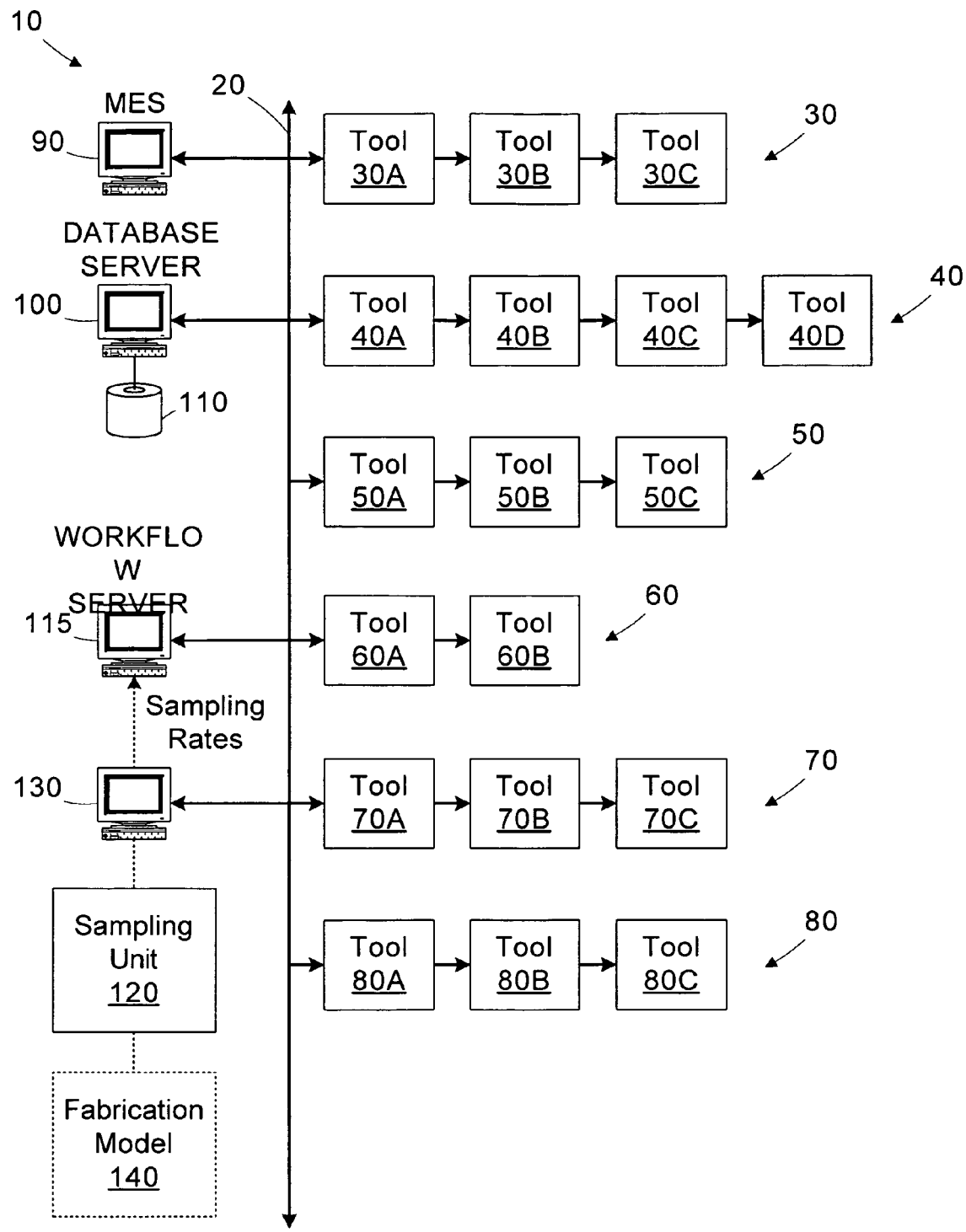
FIG. 1 is a simplified block diagram of a manufacturing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

One or more specific embodiments of the present invention will be described below. It is specifically intended that the present invention not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or CDROM), and may be read only or random access. Similarly, the transmission medium may be twisted wire pairs, coaxial cable, optical fiber, wireless or some other suitable transmission medium known to the art. The invention is not limited by these aspects of any given implementation.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to the drawings wherein like reference numbers correspond to similar components throughout the several views and, specifically, referring to FIG. 1, the present invention shall be described in the context of an illustrative manufacturing system 10. The manufacturing system 10 includes a network 20, a plurality of tools 30-80, a manufacturing execution system (MES) server 90, a database server 100 and its associated data store 110, a workflow server and a sampling unit 120 executing on a workstation 130.

In the illustrated embodiment, the manufacturing system 10 is adapted to fabricate semiconductor devices. Although the invention is described as it may be implemented in a semiconductor fabrication facility, the invention is not so limited and may be applied to other manufacturing environments. The techniques described herein may be applied to a variety of workpieces or manufactured items, including, but not limited to, microprocessors, memory devices, digital signal processors, application specific integrated circuits (ASICs), or other devices. The techniques may also be applied to workpieces or manufactured items other than semiconductor devices.

The network 20 interconnects various components of the manufacturing system 10, allowing them to exchange information. Each of the tools 30-80 may be coupled to a computer (not shown) for interfacing with the network 20. The tools 30-80 are grouped into sets of like tools, as denoted by lettered suffixes. For example, the set of tools 30A-30C represent tools of a certain type, such as a chemical mechanical planarization (CMP) tool.

A particular wafer or lot of wafers progresses through the tools 30-80 as it is being manufactured, with each tool 30-80 performing a specific function in the process flow. Exemplary processing tools for a semiconductor device fabrication environment include metrology tools, photolithography steppers, etch tools, deposition tools, polishing tools, rapid thermal processing tools, implantation tools, etc. The tools 30-80 are illustrated in a rank and file grouping for illustrative purposes only. In an actual implementation, the tools 30-80 may be arranged in any physical order or grouping. Additionally, the connections between the tools in a particular grouping are meant to represent connections to the network 20, rather than interconnections between the tools 30-80.

The manufacturing execution system (MES) server 90 directs the high level operation of the manufacturing system 10. The MES server 90 monitors the status of the various entities in the manufacturing system 10 (i.e., lots, tools 30-80) The database server 100 stores data related to the status of the various entities and articles of manufacture in the process flow using one or more data stores 110. The data may include pre-process and post-process metrology data, tool states, lot priorities, etc.

The MES server 90 stores information in the data store 110 related to the particular tools 30-80 (i.e., or sensors (not shown) associated with the tools 30-80) used to process each lot of wafers. As metrology data is collected related to the lot, the metrology data and a tool identifier indicating the identity of the metrology tool recording the measurements is also stored in the data store 110. The metrology data may include feature measurements, process layer thicknesses, electrical performance, surface profiles, etc. Data stored for the tools 30-80 may include chamber pressure, chamber temperature, anneal time, implant dose, implant energy, plasma energy, processing time, etc. Data associated with the operating recipe settings used by the tool 30-80 during the fabrication process may also be stored in the data store 110. For example, it may not be possible to measure direct values for some process parameters. These settings may be determined from the operating recipe in lieu of actual process data from the tool 30-80.

The workflow server 115 controls the flow of articles of manufacture (e.g., lots of semiconductor wafers) through the process flow, deciding the processing order, which articles are to be sampled by metrology tools 30-80, etc. Hence, the workflow server 115 controls the queues for the processing and metrology resources in the manufacturing system 10. The workflow server 115 can use various workflow management techniques, including dispatching, reservation management, etc., to control the flow of articles.

The distribution of the processing and data storage functions amongst the different computers 90, 100, 115, 130 is generally conducted to provide independence and a central information store. Of course, different numbers of computers and different arrangements may be used. Moreover, the functions of some units may be combined. For example, the workflow server 115 and the sampling unit 120 may be combined into a single unit.

As will be described in greater detail below, the sampling unit 120 actively identifies lots or wafers for sampling, not based on fixed sampling rates or production rates, but rather based upon capacity constraints of the metrology system and a simulation of the process flow within the manufacturing system 10. The sampling unit 120 employs backward and forward looking sampling rules and fabrication simulation to control the throughput and queue depth of the metrology tools during the simulation. The general premise of the simulation-based dynamic sampling approach implemented by the sampling unit 120 is to determine sampling rates based on a relatively fixed metrology capacity. The metrology capacity is fixed by keeping a constant queue length, and making the sampling decisions to maintain this queue length.

The sampling unit 120 employs a fabrication simulation model 140 of the fabrication facility for predicting future processing workflows based on the current WIP and status of the manufacturing system 10. The fabrication simulation model 140 employs various backward and forward looking sampling rules, described in greater detail below, to predict the sampling activities of the manufacturing system 10. In making sampling decisions, the sampling unit 120 attempts to keep a fixed queue length for the metrology tools 39-80 in the manufacturing system 10.

The sampling unit 120 is refreshed periodically to retrieve the latest WIP information of the manufacturing system 10, including the current operation of particular lots. The sampling unit 120, in turn, refreshes the fabrication simulation model 140. The fabrication simulation model 140 also includes the latest tool availability and production flow information. The fabrication simulation model 140 may be implemented using commercially available software, such as AutoSched AP™, offered by Brooks Automation, Inc. of Chelmsford, Mass.

Because the sampling unit 120 uses the fabrication simulation model 140 to predict future processing based on the current WIP of the manufacturing system 10, actual or predicted production rates are not required for making sampling decisions. Instead, the sampling decisions are made based on the capacity constraints of the metrology system, as is illustrated in greater detail below. The fabrication simulation model 140 outputs sampling rates for a particular time period that may be used by the workflow server 115 to identify lots for sampling.

One parameter used in the determination of sampling decisions by the fabrication simulation model 140 is defined as a sampling weighting metric, Q. The value of Q provides a weighting factor for differentiating between different layers in the fabrication of a lot. In other words, different layers have different measurement priorities. A particular lot has a Q value corresponding to the current layer being fabricated. Lots with layers having a higher Q value have a higher probability of being sampled, as data collected regarding the more important layers may be more useful for increasing the accuracy of the associated process control models. The unit Q sampling rate of a layer, m, may be defined as the number of lots sampled of layer M divided by $Q_m$. The number of lots sampled with various layers increases linearly with the Q weight for the layer. For example, a layer with a Q value of 3 is sampled three times as often as a layer with a Q value of 1. Hence, the unit Q sampling rates, which are normalized by Q, are roughly the same across the different layers.

The unit Q sampling rates may be compared to one another using an average unit sampling rate that reflects the metrology capacity of the manufacturing system 10. The average unit sampling rate is the number of lots that would be sampled for a layer with a particular Q value if all layers were sampled exactly in proportion to their Q values based on the capacity of the metrology system. If the unit Q sampling rate divided by the average unit sampling rate is less than 1, the layer is undersampled, while if the average unit Q sampling rate is greater than 1, the layer is oversampled. The average unit sampling rate may be determined using a static or dynamic technique, depending on the particular implementation.

A first static approach may be implemented based upon long-run planning capacity of the manufacturing system 10. The planning capacity reflects the number of wafer starts per week. This capacity is predefined and is usually used to calculate the WIP level given the cycle time or the cycle time given the WIP level. Each tool/tool family also has a planning capacity. If a particular tool family is the bottleneck tool family, its planning capacity equal the overall planning capacity. If all lots were to pass through the metrology tools, the metrology tools would always be the bottlenecks. Therefore, to avoid metrology tool bottlenecks, lots are sampled to maintain a steady production flow. Therefore, the average unit sampling rate may be defined as the average planned sampling rate for the metrology tools, which is the metrology planning capacity/overall planning capacity. This number may be adjusted to consider the potential preventative maintenance and downtime (e.g. 15% of the metrology planning capacity will be lost due to the machine unavailability).

Using the fabrication simulation model 140, a dynamic approach may be use to determine the average unit sampling rate at any particular time instant based on the current conditions of the manufacturing system 10. The dynamic average unit sampling rate may change every time a new lot is sampled. The dynamic approach uses the current sampling rates of different layers as initial states to derive the average unit sampling rate. The dynamic average unit sampling rate may be determined using the equation:

$$USR_{avg} = \frac{\sum_N \frac{SamplingRate_{layer\ n}}{Q_n}}{N},$$

where N represents the number of layers for which weighting factors, $Q_n$, are defined.

This dynamic average unit sampling rate may then be dynamically adjusted by the fabrication simulation model 140 based upon the simulated WIP information. For purposes of the following illustrations, it is assumed that the sampling unit 120 employs a dynamic average unit sampling rate.

Figure 2:
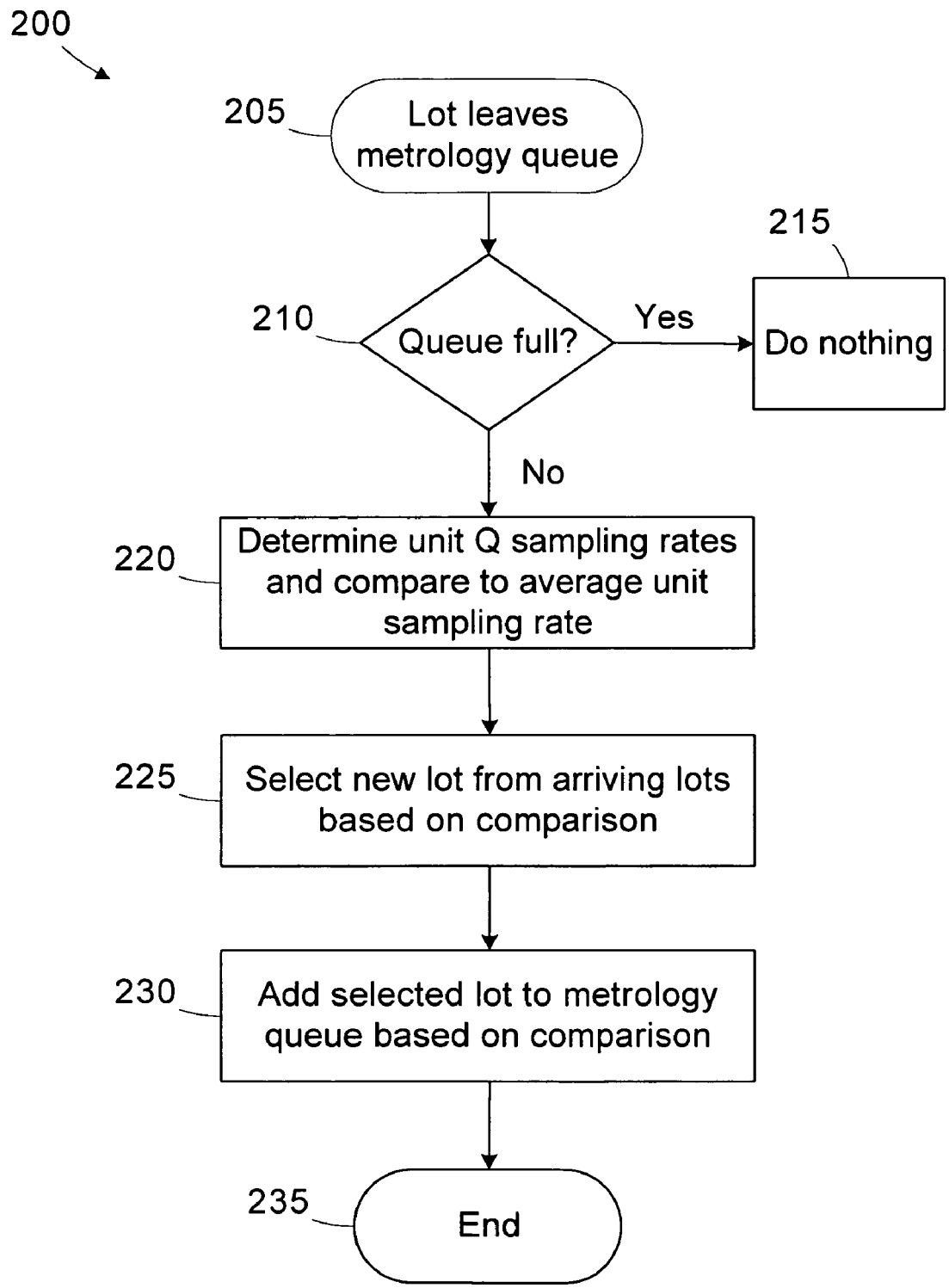
FIG. 2 is a simplified flow diagram of a method for implementing sampling decisions using a backward sampling rule.
Figure 3A:
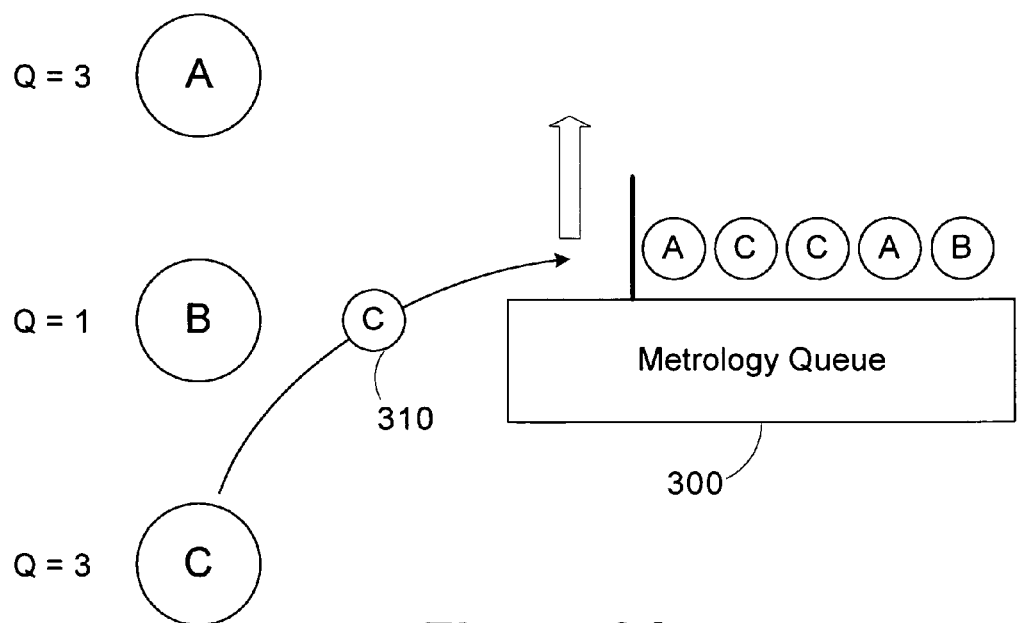
FIGS. 3A-3C are diagrams of a metrology queue during the implementation of the method of FIG. 2.
Figure 3B:
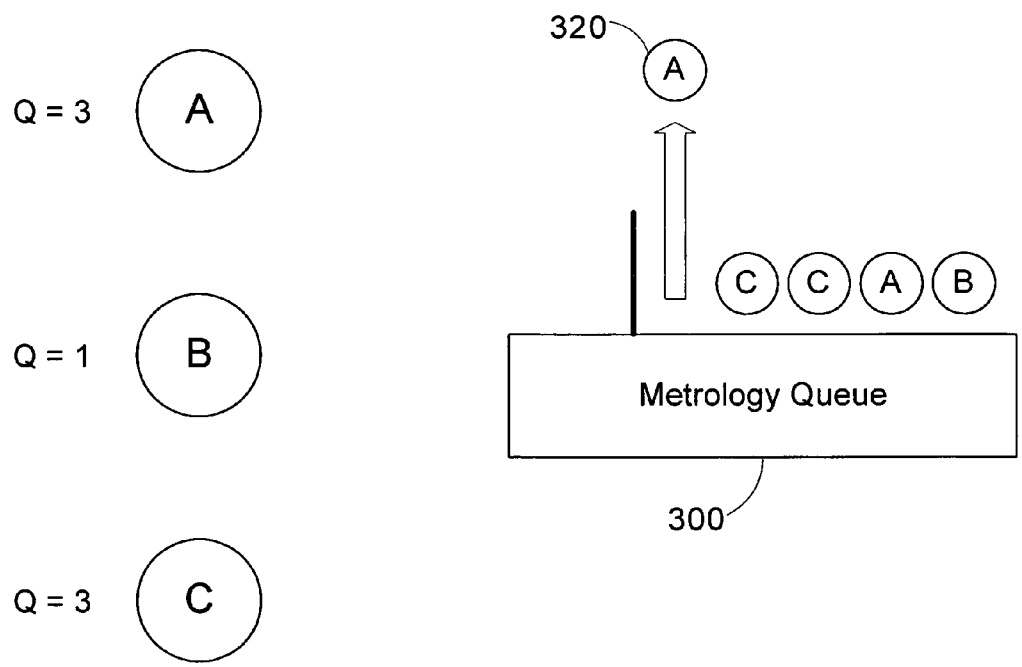
Figure 3C:
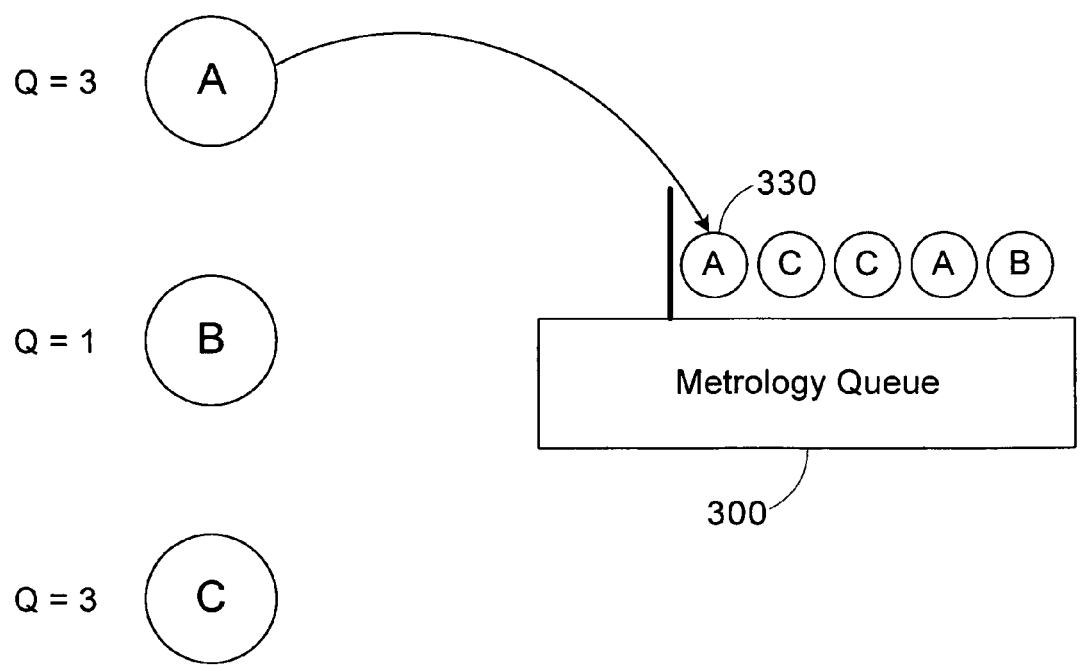

Turning now to FIGS. 2 and 3A-C, an illustrative backward sampling technique implemented by the fabrication simulation model 140 is illustrated. The fabrication simulation model 140 predicts the exit of various lots from the metrology queue 300 and the arrival of various lots to the metrology queue 300. FIG. 2 is a simplified block diagram of a method 200 for determining sampling decisions, and FIGS. 3A-C are diagrams of a metrology queue 300 illustrating the operation of the method 200. In the exemplary metrology queue 300 of FIG. 3, lots having layer designations of A, B, and C are shown, with corresponding Q values of 3, 1, and 3, respectively. In the example, the queue depth is 5 lots. In actual implementation, the metrology queue may represent multiple metrology tools and may have a much deeper queue, such as in excess of 100 lots. Also, many more layers may be represented. Typically, metrology queues are processed in last-in first-out order to capture the most recent metrology data. However, other factors, such as lateness or required completion time may be used to affect the order of processing.

In the example of FIG. 3A, the metrology queue 300 is full, so any lots entering the metrology step, such as a lot 310 (layer C), are ignored and proceed to the next process step. Backward sampling rules are applied when a lot leaves the metrology queue 300, as shown in FIG. 3B when the measurement of lot 320 (layer A) is completed. As seen in FIG. 2, the backward sampling technique begins when a lot leaves the metrology queue 300 in block 205. If the metrology queue 300 is full in block 210, no new lots are added to the metrology queue 300 in block 215. If the metrology queue 300 is not full in block 210, the fabrication simulation model 140 determines the unit Q sampling rates of each layer and compares them to the average unit sampling rate in block 220. In block 225, the fabrication simulation model 140 selects a new lot from those arriving at the metrology queue 300 following the completion of their associated previous process step based on the comparison of the unit Q sampling rates performed in block 220. In block 230, the selected lot is added to the metrology queue 300, and the backward sampling method 200 ends in block 235.

Various techniques may be used for selecting the next lot to add to the metrology queue 300. For example, the sampling unit 120 may select a lot with a layer having the lowest unit Q sampling rate. Alternatively, the sampling unit 120 may select the first arriving lot with an undersampled layer. As seen in FIG. 3C, the lot selected based on the unit Q sampling rates (e.g., lot 330 (layer A)) is added to the metrology queue 300.

The backward sampling rules used by the fabrication simulation model 140 for predicting the operation of the manufacturing system 10 may also be implemented by the workflow server 115 to make metrology reservations for lots in the actual process flow.

Figure 4:
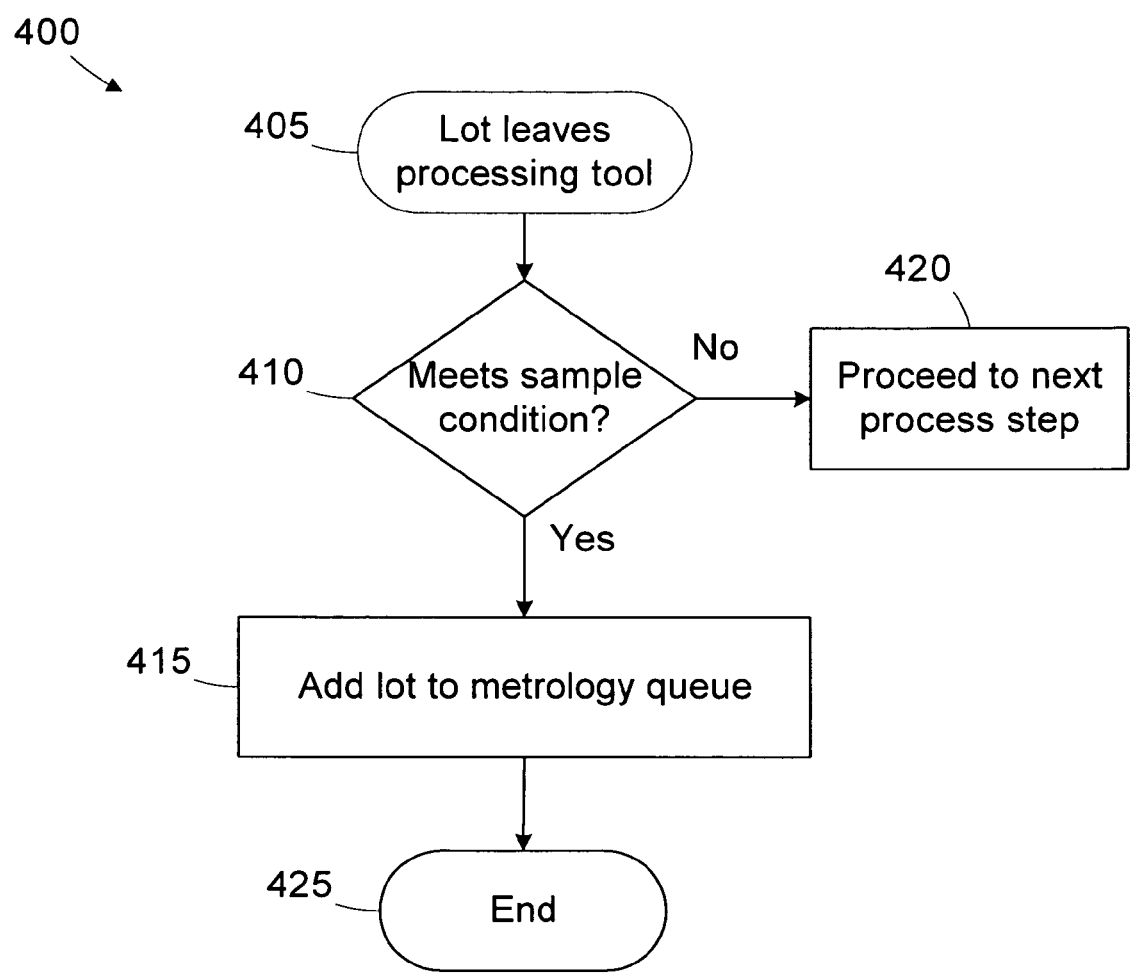
FIG. 4 is a simplified flow diagram of a method for implementing sampling decisions using a forward sampling rule.
Figure 5A:
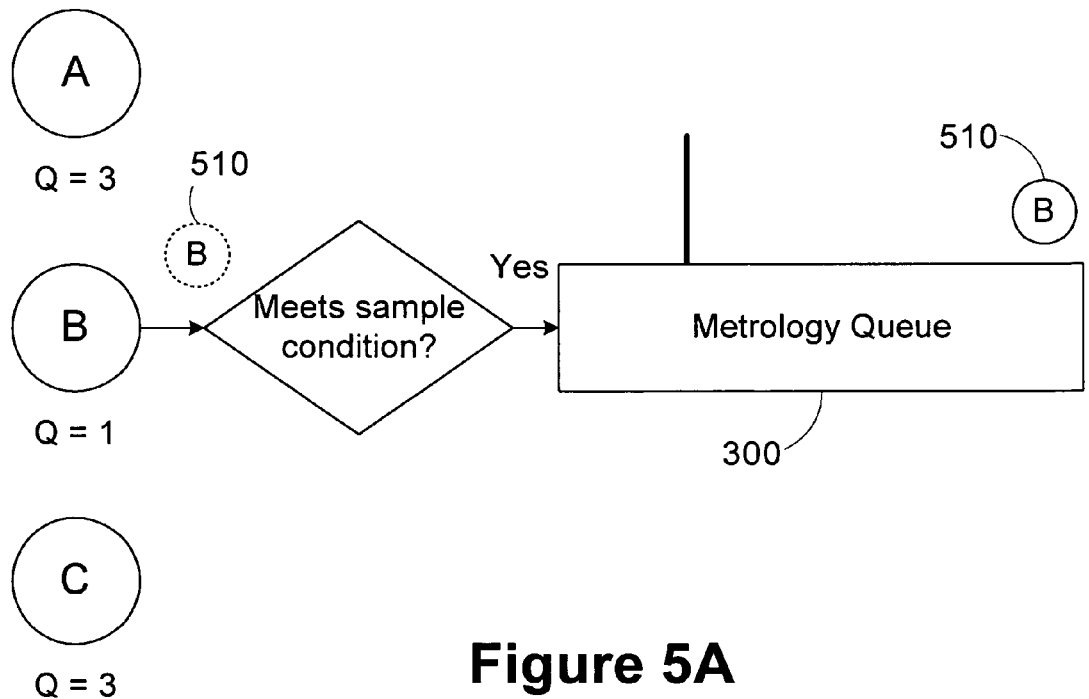
FIGS. 5A-5B are diagrams of a metrology queue during the implementation of the method of FIG. 2.
Figure 5B:
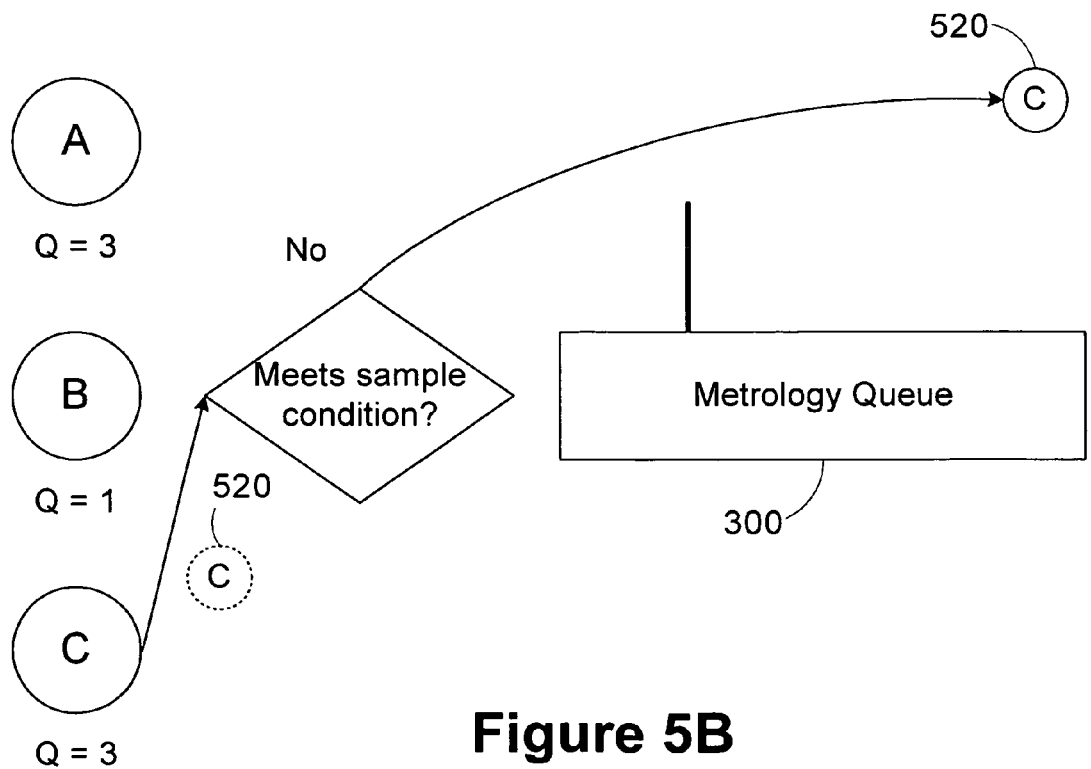

Turning now to FIGS. 4 and 5A-B, an illustrative forward sampling technique implemented by the fabrication simulation model 140 is illustrated. The forward sampling rules are followed because the actual conditions in the manufacturing system 10 do not always match the simulated conditions, and a metrology queue 300 may have capacity to process additional lots other than those for which are added to the metrology queue 300 using the backward sampling rules illustrated above. The forward sampling rules are used by the fabrication simulation model 140 and may also be used by the workflow server 115 for dispatching decisions in the production operation of the manufacturing system 10.

FIG. 4 is a simplified block diagram of a method 400 for identifying lots for sampling, and FIGS. 5A-B are diagrams of the metrology queue 300 illustrating the operation of the method 400. The method 400 begins in block 405 when a lot leaves a processing tool 30-80. If the lot meets a forward sampling condition in block 410, it is added to the metrology queue 300 in block 415. Exemplary sampling conditions are provided below. If a sampling condition is not met in block 410, the lot proceeds to the next process step in block 420. The forward sampling method 400 ends in block 425.

As seen in FIG. 5A, lot 510 (layer B) meets a sampling condition and is added to the metrology queue 300. In FIG. 5B, lot 520 (layer C) does not meet a sampling condition and bypasses the metrology queue 300 to the next process step.

Various sampling conditions may be defined for filling vacancies in the metrology queue 300. Generally, the sampling decisions may depend on a configurable maximum queue depth, MAXQUEUE, and the unit Q sampling rates. The forward sampling rules are implemented by the sampling unit 120 to avoid starving the metrology tools 30-80 making up the metrology queue 300. In the illustrated embodiment the sampling conditions are:

A lot will be sampled if any of the following conditions are met:
Current queue length of metrology queue 300 is less than MAXQUEUE/2;
Current unit Q sampling rate of the layer that the lot is in is less than a minimum predefined sampling rate; or
Current layer has a unit Q Sampling rate that is lower than the average unit sampling rate.

A lot selected for sampling above will not be sampled if any of the following conditions are met, thus overriding one or more of the positive rules:

Current queue length of metrology queue 300 is more than 3*MAXQUEUE/2; or
Current layer has a maximum predefined unit Q-Sampling rate.

Of course, additional or different sampling rules may be employed, depending on the particular implementation. For example, lots in the metrology queue 300 may be bumped or lots may not be sampled to avoid starving a downstream bottleneck process tool. Also, if the upstream process tool has a large WIP bubble, a current lot may bypass the metrology queue 300 because other lots will soon arrive to fill the metrology queue 300. Other global sampling rules, such as sampling after a preventative maintenance (PM) activity, may also be incorporated into the forward sampling rules.

Within a metrology queue 300 various techniques may be used for selecting the order of processing. In a metrology queue 300 having a depth in excess of 100 lots, higher priority lots (e.g., lots having layers with the lowest unit Q sampling rates) are typically selected first. Three exemplary dispatching rules that incorporate the unit Q sampling rate are provided. Typically, one of the dispatching rules is selected for implementation. Again, the workflow server 115 may also employ the same dispatching rules for the actual process flow.

CR+Q: This rule is an extension of Critical Ratio. The priority of a lot in the layer that has the lowest unit Q-sampling rate will be increased.

Q: This rule dispatches lots purely based on their weighting factors (Q values). A lot in the layer with minimum unit Q-sampling rate will be dispatched first.

Setup+Q: This rule balances setup time and unit Q-sampling rate so that the utilization of metrology can be improved.

Additional rules may be generated by combining one or more of the rules provided above to include multiple factors. For example, critical ratio and setup factors may be included in a single rule.

The preceding examples used Q values associated with the layer being processed for a lot. In other embodiments, Q values may be assigned for multiple layers as well as multiple tools 30-80 for processing the layers. By weighting the layers and tools separately, sampling can be automatically controlled so that adequate sampling is achieved not only for the layers, but also for the each tool that processes a particular layer. This combined approach increases the likelihood that sufficient metrology data will be collected to supply the process controllers for the various tools to update their control model states. A tool that has a lower health or has just completed a PM procedure may be sampled more frequently by increasing its weight metric.

Figure 6:
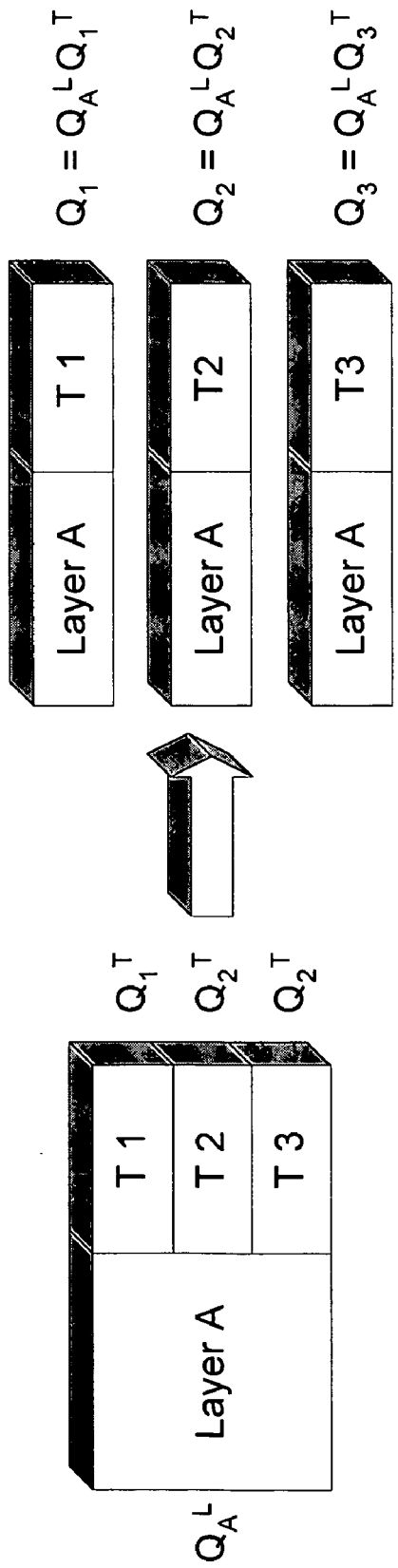
FIG. 6 is a diagram illustrating composite weighting factors implemented by the system of FIG. 1 incorporating layer and process tool factors.

As shown in FIG. 6, a composite Q value may be defined by multiplying the respective layer weighting value, $Q^L$, and tool weighting value, $Q^T$. As seen in FIG. 6, a particular layer, e.g., Layer A, may be processed by three tools, T1, T2, and T3. The layer weighting factor, $Q_A^L$, may be combined with the tool weighting factors, $Q_1^T, Q_2^T, Q_3^T$, to generate composite weighting factors, $Q_1, Q_2, Q_3$. Subsequently, unit Q sampling rates may be determined for the composite weighting factors, and sampling rates.

Returning to FIG. 1, the fabrication simulation model 140 employs an offline approach to predict the future processing in the manufacturing system 10, but this prediction does not always represent the actual implementation. The fabrication simulation model 140 provides supervisory information based on current status of the manufacturing system 10 when the simulation is performed. Therefore, the forward and backward sampling rules are used to estimate sampling rates. The forward sampling rules may be implemented by the workflow server 115 in controlling the actual process flow in the manufacturing system 10. The backward sampling rules may also be used when a scheduling system (i.e., forward looking system) is implemented in the manufacturing system 10 by the workflow server 15, as opposed to a dispatching system. In a scheduling approach, it is known in advance whether a lot is sampled and, if a lot is sampled, which tool 30-80 will process the lot.

The forward sampling rules augment the backward sampling rules, because even if a new lot is added each time a lot exits the metrology queue 300, the ideal case where the metrology tools and upstream processing machines have the same production rate is unlikely to occur in the production flow. For example, following a PM, no lots are in the metrology queue 300, so no lots would leave the queue 300 to trigger the backward rule. The forward sampling rules are employed to fill the metrology queue 300. Also, while the metrology tool 30-80 is setting up a different recipe, (i.e., setup on a metrology tool typically takes much longer than the actual processing time) and its actual processing time is much less than the processing time of upstream tool, initially no lot will leave the metrology tool to trigger backward sampling. Hence, without the forward sampling rules to build up sufficient WIP, the metrology tool 30-80 would be idle most of the time. Many other types of disruptions, such as those arising from process control scenarios, are also evident in the manufacturing system 10. Generally, the backward sampling rules are directed to WIP control, and the forward sampling rules are directed to exception handling or avoiding starvation of the metrology tools 30-80.

The outputs of the fabrication simulation model 140 are the sampling rates of different layers in a given time horizon. The fabrication simulation model 140 may also provide the simulated metrology utilization, average completion time, queue length, etc. and determine the overall impact to the manufacturing system 10 in terms of average completion time, WIP, etc.

Generally, the backward and forward sampling rules are techniques used by the fabrication simulation model 140 to determine the proper sampling rates given the capacity constraints of the metrology system. Typical dispatch systems employed in a fabrication facility employ sampling rates that are substantially fixed or changed infrequently by manual intervention. The sampling unit 120, by implementing the fabrication simulation model 140, allows the determination of dynamic sampling rates over any specified time horizon. The sampling unit 120 may communicate these dynamic sampling rates to the workflow server 115, which in turn uses them to determine the actual lots to be sampled. The workflow server 115 may employ logic for sampling lots to attempt to match the number of lots sampled to the sampling rates. The workflow server 115 may implement a different workflow scheme than that implemented in the fabrication simulation model 140, for example, using different dispatch rules. The sampling unit 120 dynamically adjusts these sampling rates by considering the capacity constraints of the metrology system, and the workflow server 115 controls the process flow to realize the designated sampling rates.

The sampling unit 120 may be invoked to execute the fabrication simulation model 140 at predetermined time intervals (e.g., hourly, daily, per shift), at any desired time (e.g., after a disruption), or as triggered by operators for purpose of analysis. Each time the fabrication simulation model 140 is triggered, the sampling unit 120 downloads the latest information for the manufacturing system 10. Accordingly, the sampling rates output by the fabrication simulation model 140 are always based on the current status of the manufacturing system 10 and the resulting metrology capacity.

The sampling unit 120 may invoke the fabrication simulation model 140 following a disruption in the manufacturing system 10, such as unscheduled downtime to dynamically adjust the sampling rates. Typically, if a Q value is changed for a layer or a tool 30-80, if composite Q values are used, the sampling unit 120 re-executes the fabrication simulation model 140 to adjust the sampling rates based on the changed circumstances.

Allocating the metrology resources of the manufacturing system 10 using a simulation-based model allows the capacity constraints to be considered when determining sampling rates. Considering the capacity constraints reduces the likelihood that a metrology resource will become a bottleneck or be underutilized. An increase in metrology efficiency results in an increase in the efficiency of the entire manufacturing system 10, thereby reducing cost, increasing quality, and increasing overall profitability.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. A method for determining metrology sampling rates for workpieces in a process flow, comprising:
    determining a current status of the process flow;
    simulating future processing of the workpieces in the process flow based on the current status of the process flow over a predetermined time horizon to predict metrology sampling rates for the workpieces;
    implementing sampling rules during the simulating that consider capacity constraints of a metrology resource in the process flow; and
    sampling actual workpieces in the process flow based on the predicted sampling rates to collect metrology data associated with the actual workpieces.

2. The method of claim 1, wherein implementing the sampling rules further comprises implementing the sampling rules to maintain a substantially constant queue depth for the metrology resource.

3. The method of claim 1, wherein implementing the sampling rules during the simulating further comprises implementing a backward sampling rule each time a workpiece exists the metrology resource.

4. The method of claim 3, wherein implementing the backward sampling rule further comprises selecting a workpiece for sampling in the metrology resource responsive to a current sampling rate of workpieces having a process characteristic matching the selected workpiece being less than an average sampling rate.

5. The method of claim 3, further comprising implementing the backward sampling rule in the process flow.

6. The method of claim 1, wherein implementing the sampling rules during the simulating further comprises implementing a forward sampling rule each time a workpiece exists a processing resource and enters the metrology resource.

7. The method of claim 6, wherein implementing the forward sampling rule comprises sampling the workpiece entering the metrology resource responsive to a queue length of the metrology resource being less than a predetermined threshold.

8. The method of claim 6, wherein implementing the forward sampling rule comprises sampling the workpiece entering the metrology resource responsive to a current sampling rate of workpieces having a process characteristic matching the workpiece being less than a minimum sampling rate.

9. The method of claim 6, wherein implementing the forward sampling rule comprises sampling the workpiece entering the metrology resource responsive to a current sampling rate of workpieces having a process characteristic matching the workpiece being less than an average sampling rate.

10. The method of claim 6, wherein implementing the forward sampling rule comprises not sampling the workpiece entering the metrology resource responsive to a queue length of the metrology resource being greater than a predetermined threshold.

11. The method of claim 6, wherein implementing the forward sampling rule comprises not sampling the workpiece entering the metrology resource responsive to a current sampling rate of workpieces having a process characteristic matching the workpiece being greater than a maximum sampling rate.

12. The method of claim 6, further comprising implementing the forward sampling rule in the process flow.

13. The method of claim 1, further comprising:
grouping the workpieces based on a processing characteristic;
assigning sampling weighting factors to the groupings of workpieces, the sampling weighting factors determining a relative importance of collecting metrology data for the associated grouping; and
selecting workpieces for sampling during the simulating based at least in part on the sampling weighting factors.

14. The method of claim 13, wherein the workpieces comprise semiconductor wafers, and the process characteristic comprises a layer to be processed on each workpiece.

15. The method of claim 13, wherein the workpieces comprise semiconductor wafers, and the process characteristic comprises a layer to be processed on each workpiece and a tool in the process flow used to process the layer.

16. The method of claim 13, further comprising, during the simulating:
determining an average unit sampling rate for all of the groupings;
determining a unit sampling rate for each grouping based on the sampling weighting factor associated with the grouping;
comparing the unit sampling rate to the average unit sampling rate; and
implementing the sampling rules based on the comparison.

17. The method of claim 16, wherein implementing the sampling rules further comprises selecting a workpiece for sampling responsive to the unit sampling rate for its associated grouping being less than the average unit sampling rate.

18. The method of claim 16, wherein implementing the sampling rules further comprises not selecting a workpiece for sampling responsive to the unit sampling rate for its associated grouping being greater than the average unit sampling rate.

19. The method of claim 1, further comprising processing workpieces in the process flow after determining the predicted sampling rates.

20. A system, comprising:
a plurality of tools for processing workpieces in a process flow; and
a sampling unit operable to determine a current status of the process flow, the sampling unit being further operable to employ a fabrication simulation model to simulate future processing of the workpieces in the process flow based on the current status of the process flow over a predetermined time horizon to predict metrology sampling rates for the workpieces and implement sampling rules during the simulating that consider capacity constraints of a metrology resource in the process flow; and
a workflow controller operable to sample actual workpieces in the process flow based on the predicted metrology sampling rates.

21. A sampling controller comprising a processing device operable to execute instructions that when implemented perform a method, comprising:
determining a current status of a process flow;
simulating future processing of workpieces in the process flow based on the current status over a predetermined time horizon to predict sampling rates of the workpieces;
implementing sampling rules during the simulating that consider capacity constraints of a metrology resource in the process flow; and
communicating the predicted sampling rates to an entity operable to control the process flow.

* * * * *